US007741902B2

(12) United States Patent
Guo et al.

(10) Patent No.: US 7,741,902 B2
(45) Date of Patent: Jun. 22, 2010

(54) CIRCUIT AND METHOD FOR GENERATING A PWM CONTROL SIGNAL FOR A CLASS-D AMPLIFIER

(75) Inventors: Jwin-Yen Guo, Zhubei (TW); Shao-Ming Sun, Zhubei (TW)

(73) Assignee: Richtek Technology Corporation, Hsinchu (TW)

( * ) Notice: Subject to any disclaimer, the term of this patent is extended or adjusted under 35 U.S.C. 154(b) by 73 days.

(21) Appl. No.: 12/285,710

(22) Filed: Oct. 14, 2008

(65) Prior Publication Data

US 2009/0174478 A1 Jul. 9, 2009

(30) Foreign Application Priority Data

Jan. 4, 2008 (TW) ............................. 97100382 A

(51) Int. Cl.
*H03F 3/38* (2006.01)

(52) U.S. Cl. ....................................................... 330/10

(58) Field of Classification Search .................. 330/10; 332/109; 375/238

See application file for complete search history.

(56) References Cited

U.S. PATENT DOCUMENTS

| | | | | |
|---|---|---|---|---|
| 6,763,114 | B1 * | 7/2004 | Nalbant | 381/120 |
| 7,183,840 | B2 * | 2/2007 | Maejima | 330/10 |
| 7,385,444 | B2 * | 6/2008 | Kurokawa | 330/10 |
| 2008/0284508 | A1 * | 11/2008 | Walker et al. | 330/10 |

* cited by examiner

*Primary Examiner*—Steven J Mottola
(74) *Attorney, Agent, or Firm*—Rosenberg, Klein & Lee

(57) ABSTRACT

In a class-D amplifier, the input signal is compared with a carrier signal to generate a basic PWM signal, the PWM signal is then sent to a pulse processing unit, and by comparing with a basic periodic signal, half-width of the output PWM signal is extracted. Then, in the pulse processing unit, the half-width PWM pulse signal is used to generate a complete pulse whose width equals to the output PWM signal. The output power of the class-D amplifier can be kept as large as that by using differential input signals although the input signal is single-end and the entire signal processing path is kept single-ended.

13 Claims, 8 Drawing Sheets

CIRCUIT AND METHOD FOR GENERATING A PWM CONTROL SIGNAL FOR A CLASS-D AMPLIFIER

FIELD OF THE INVENTION

The present invention is related generally to a class-D amplifier and, more particularly, to a single-end input class-D amplifier.

BACKGROUND OF THE INVENTION

Conventional audio power amplifiers suffer from low efficiency, and this causes these devices to generate heat that must be removed by large heat sinks and thereby causes the physical amplifiers to be quite large. Recently, in order to make amplifiers smaller, high-efficiency designs have been introduced. The most common solution is to use switching amplifiers, or known as class-D amplifiers. The class-D amplifiers are two to five times more efficient than class-AB amplifiers and have benefits because of the efficiency, for example, requiring smaller power supplies, eliminating heat sinks and thereby significantly reducing overall system cost, size and weight. The class-D amplifiers work by converting an analog or digital input signal into a two-level output signal using a high-frequency modulation process. This two-level signal is then fed to a power stage to switch power switches in a full or half H-bridge, which in turn feeds a passive output filter connected to a speaker. These power switches have very low switching loss, so that the amplifier has better efficiency. Most class-D amplifier systems employ a pulse width modulation (PWM) scheme, where the value of the input signal at a moment in time is represented by a fixed-voltage variable-width output pulse. A typical audio PWM amplifier works at a switching frequency of between 100 KHz and 500 KHz. Higher switching frequencies can reduce distortion but also result in lower efficiency due to the extra transitions in the output waveform. However as is well known, the class-D amplifiers have electromagnetic interference (EMI) problem, as do the majority of switching power management devices, since they are derived from switching power supply configuration.

In further detail, referring to FIG. 1, a conventional class-D amplifier in bridge-tied-load (BTL) configuration always generates two PWM signals Out+ and Out− with 180 degrees out of phase at a pair of differential outputs, and produces the differential output (Out+)−(Out−) which has an amplitude (2Vdd) twice as large as that of the PWM signal Out+ or Out−. This large amplitude results in large ripple of the load current and therefore, there is always need for an external filter to remove the high frequency switching carrier. This filter typically includes at least two high current inductors and three capacitors which are expensive and consume undesirable amounts of space. In addition, the LC filter can also ease the EMI problem since the 180 degrees out of phases PWM signals Out+ and Out− generate large EMI interference. For this reason, filterless class-D amplifiers are proposed, for example by U.S. Pat. Nos. 6,614,297, 6,847,257 and 6,970,123, which eliminate the output filter while reducing the EMI interference.

FIG. 2 is a timing diagram to illustrate the operation of a general differential input class-D amplifier, in which two differential input signals Vin+ and Vin− are compared with a sawtooth carrier Vref, respectively, to generate two PWM signals PWM+ and PWM− whose subtraction is the output PWM signal to drive the power stage of the class-D amplifier. This output PWM signal has the same amplitude as those of the PWM signals PWM+ and PWM−, and thus the load current will have smaller ripple.

For a differential input class-D amplifier, the input information and the output power are designed in the difference of the signals PWM+ and PWM−. It is obvious that the pulse difference by the signals PWM+ or PWM− compared to 50% duty cycle is half of the output PWM signal, as shown in FIG. 2. In other words, the output PWM is symmetric to the 50% duty cycle. The output power of a single-end input class-D amplifier would be a quarter times less than that of which uses fully differential signals as inputs under a same gain. Conventionally, the single-end input signal is always processed by a gain stage which turns the single-end input signal into a fully differential input signal. The subsequent ternary or quaternary PWM control signals would need to be generated by using the fully differential input signal, or under a similar idea, using two mutually 180 degrees out of phase reference waveforms of sawtooth or triangle to generate the ternary or quaternary PWM control signals.

A new modulation scheme for class-D amplifiers is proposed under the concept illustrated in FIG. 2, which can keep the output power as large as that by using differential input signals in prior arts although the input signal is single-end and the entire signal processing path is kept single-ended.

SUMMARY OF THE INVENTION

Accordingly, an object of the present invention is to provide a circuit and method for generating a PWM control signal for a class-D amplifier.

According to the present invention, the input signal of a class-D amplifier is compared with a carrier signal to generate a basic PWM signal, the basic PWM signal is then sent to a pulse processing unit, and by comparing with a basic periodic signal, half-width of the output PWM signal is extracted. Then the half-width PWM pulse signal is used to generate a complete pulse whose width equals to the output PWM signal in the pulse processing unit. In an embodiment, a hysteresis comparator is used to generate the basic PWM signal.

While it is a single-end input signal for a class-D amplifier and the entire signal processing path is kept single-ended, the class-D amplifier can provide an output power as large as that by using differential input signals.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
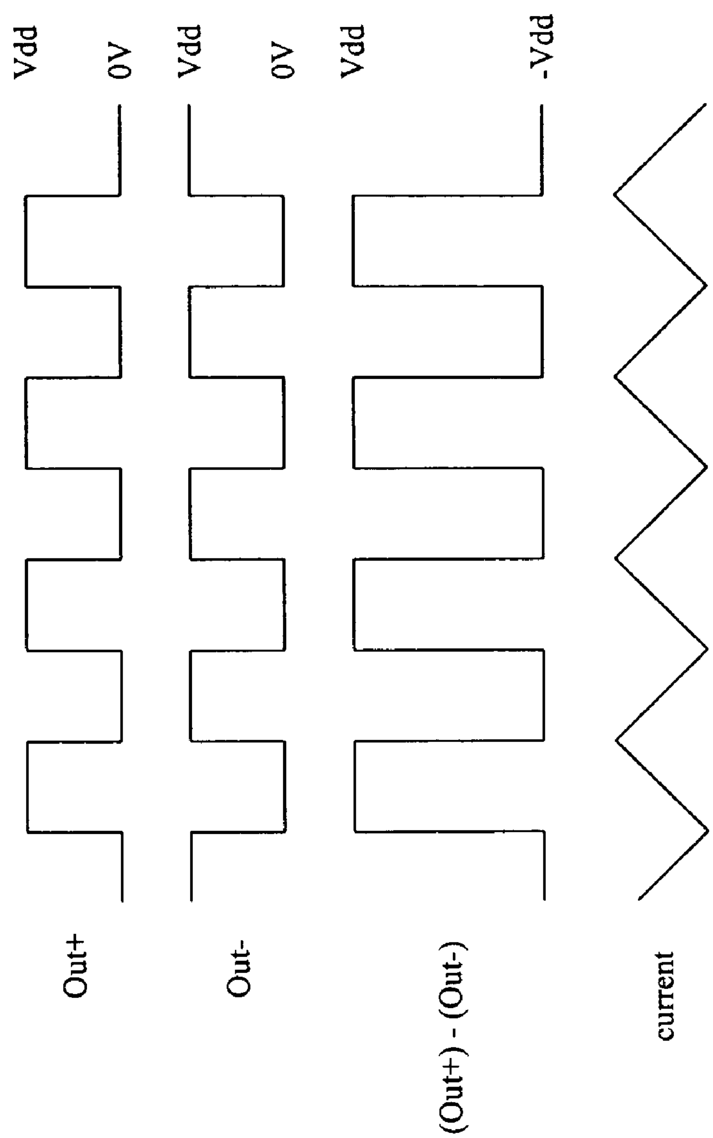
FIG. 1 is a timing diagram to show the PWM signals of conventional class-D amplifiers.
Figure 2:
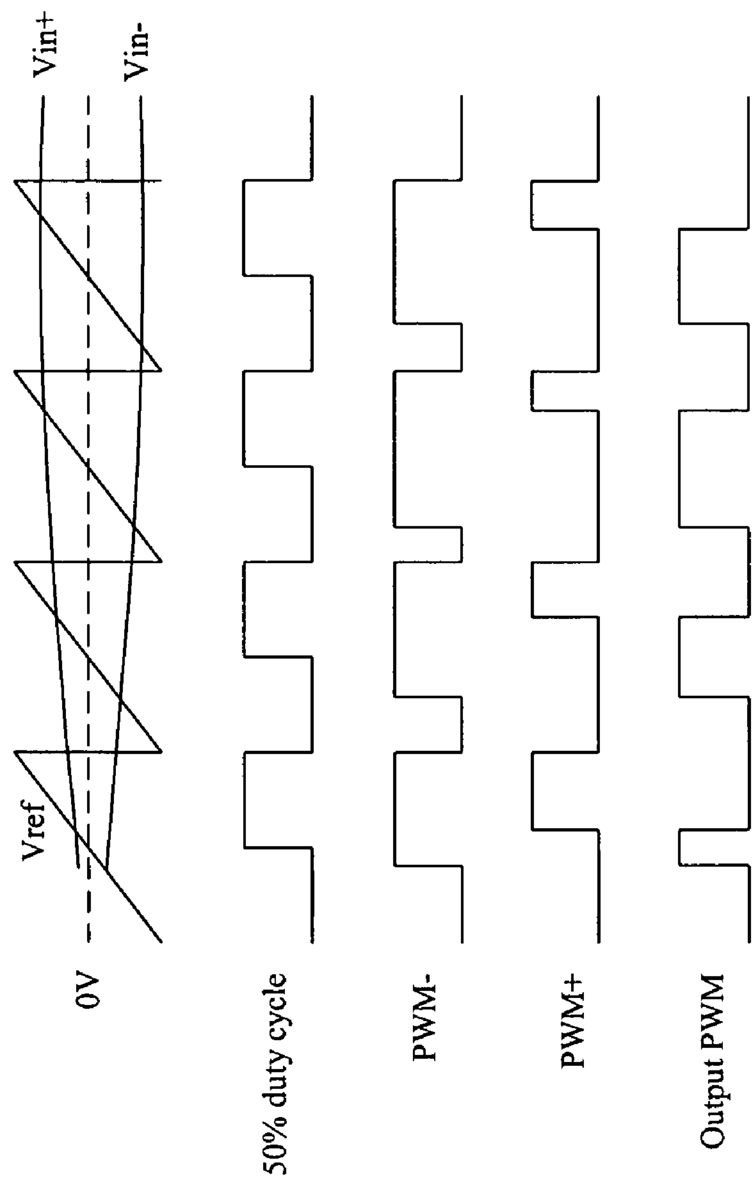
FIG. 2 is a timing diagram to show the operation of general differential input class-D amplifiers.
Figure 3:
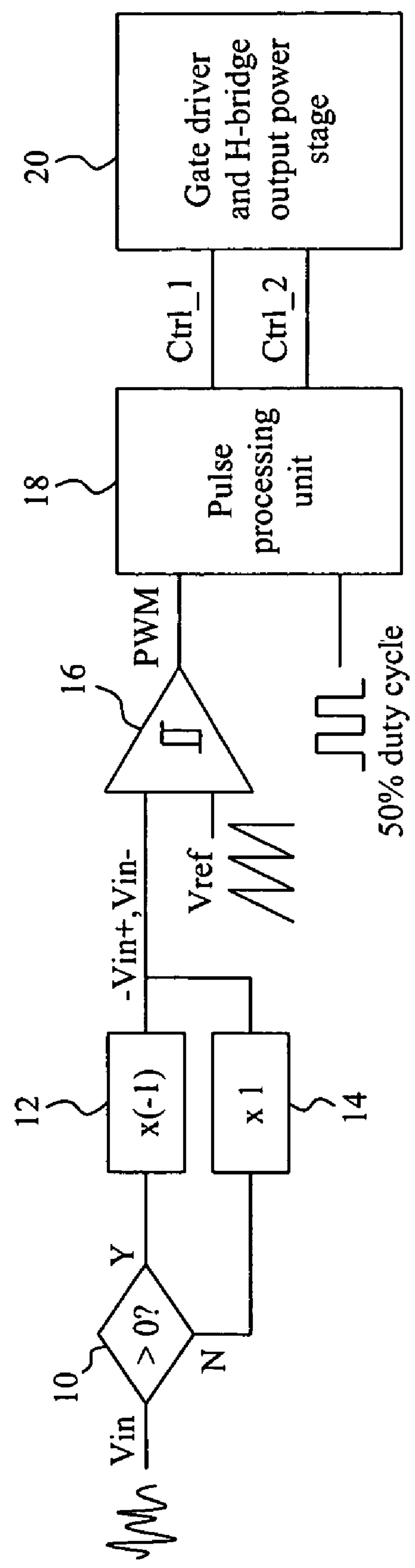
FIG. 3 is a block diagram of a first embodiment according to the present invention.

FIG. 3 is a block diagram of a first embodiment according to the present invention. This single-end input class-D amplifier has an input Vin to receive an input signal. When a single-end input signal Vin is detected, its polarity is to be identified first. This is done by a polarity identifying circuit 10 in a pre-processing unit. For example, the polarity identifying circuit 10 may include a comparator to compare the single-end input signal Vin with a direct current (DC) voltage, for example 0 volt. The pre-processing unit further includes an inverter 12 and a bypass circuit 14, both coupled to the polarity identifying circuit 10. The input signal Vin would be inverted by the inverter 12 if it is positive and if it is negative, it would be bypassed to combine with the output of the inverter 12. Therefore, the single-end input signal Vin is pre-processed by the pre-processing unit into a negative single-end input signal for a hysteresis comparator 16 to compare with a carrier signal Vref to generate a basic PWM signal. The carrier signal Vref may have a sawtooth or ramp waveform. From the basic PWM signal, a pulse processing unit 18 extracts half-width of the output PWM signal by comparing the basic PWM signal with a basic periodic signal, for example 50% duty cycle, and generates a complete pulse whose width equals to the output PWM signal. Subsequently, two PWM control signals Ctrl_1 and Ctrl_2 are produced for a gate driver and H-bridge output power stage 20. The PWM control signals Ctrl_1 and Ctrl_2 have the same pulse width and the same phase as those of the output PWM signal shown in FIG. 2.

Figure 4:
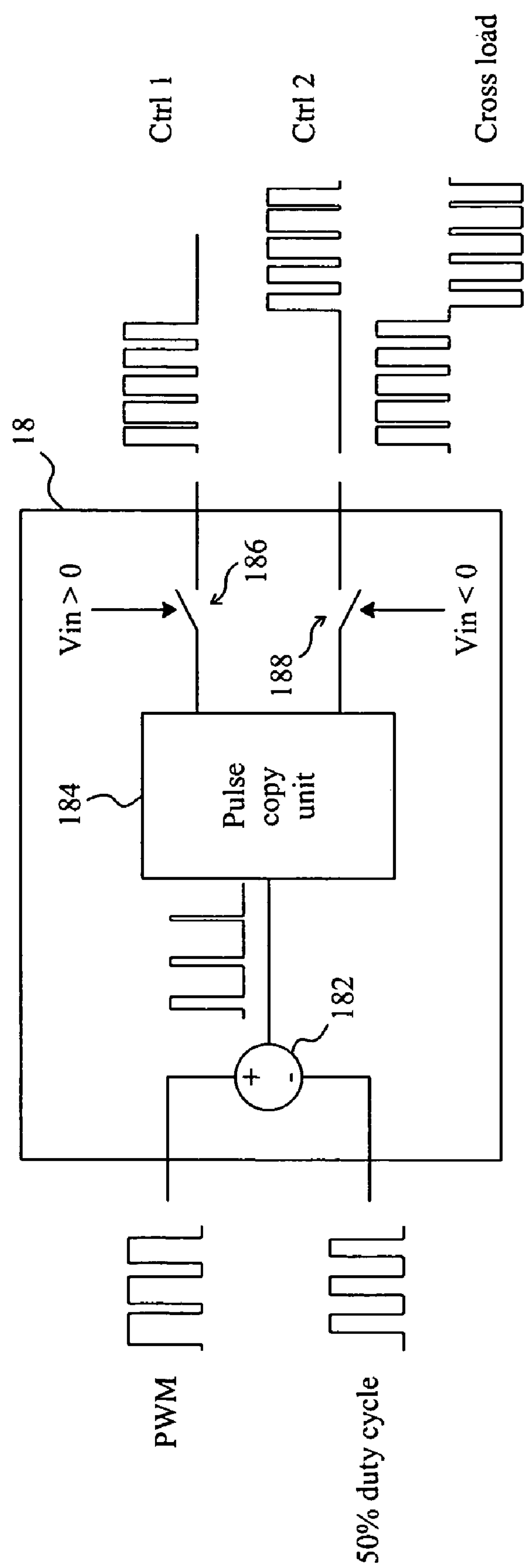
FIG. 4 is an embodiment for the pulse processing unit shown in FIG. 3.
Figure 5:
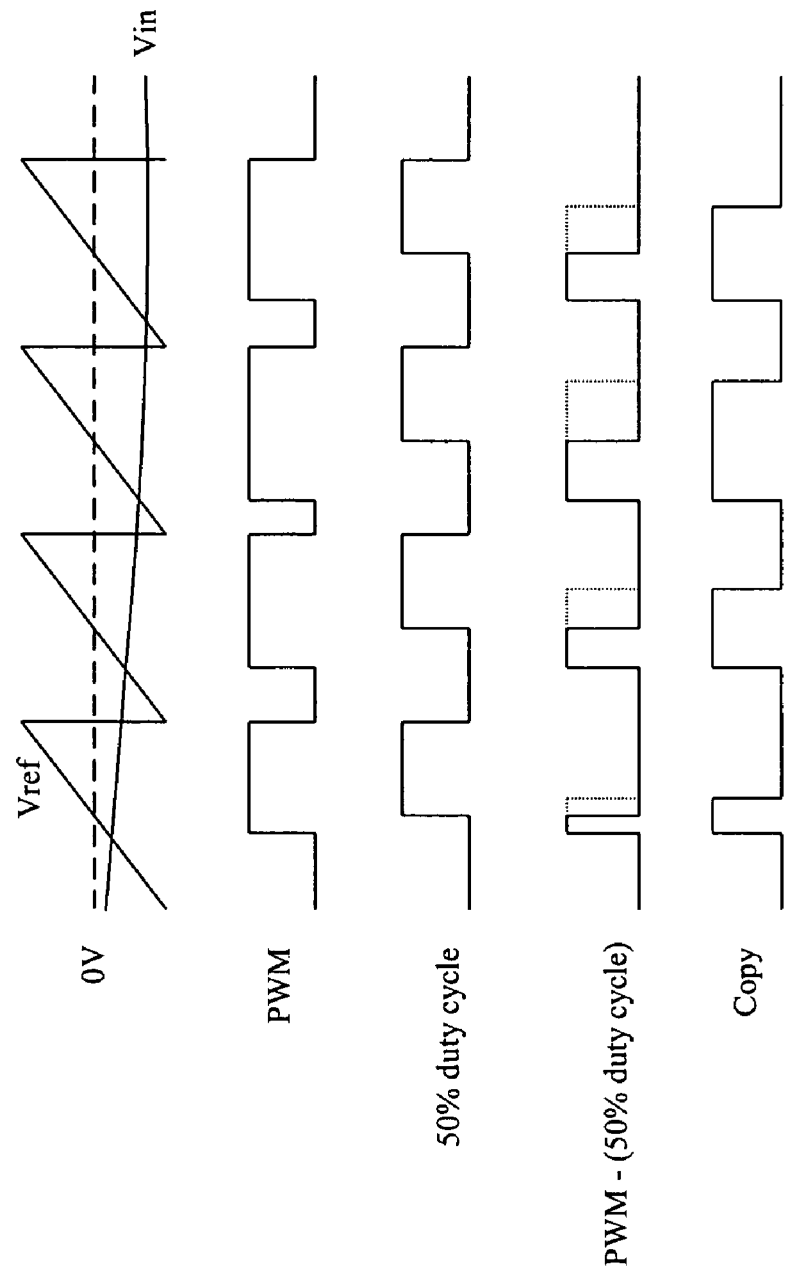
FIG. 5 is a timing diagram to show the operation of the circuit of FIG. 3.

FIG. 4 is an embodiment for the pulse processing unit 18, which is now described with reference to the timing diagram shown in FIG. 5. The basic periodic signal, for example a clock, has a 50% duty cycle, and is subtracted from the basic PWM signal by a subtractor 182 to generate a half-width PWM signal as the waveform PWM−(50% duty cycle) shown in FIG. 5. Then, a pulse copy unit 184 copies the pulse of the half-width PWM signal to produce a complete pulse as shown by the waveform Copy of FIG. 5. Next, switches 186 and 188 are switched according to the polarity of the single-end input signal Vin to determine the output of the pulse processing unit 18. If the single-end input signal Vin is positive, the switch 186 is closed and the switch 188 is open, so that the PWM control signal Ctrl_1 is equal to the output PWM signal Copy and the PWM control signal Ctrl_2 is 0. On the contrary, if the single-end input signal Vin is negative, the switch 186 is open and the switch 188 is closed, so that the PWM control signal Ctrl_1 is 0 and the PWM control signal Ctrl_2 is equal to the output PWM signal Copy. The voltage applied to the load is the difference between the PWM control signals Ctrl_1 and Ctrl_2.

Figure 6:
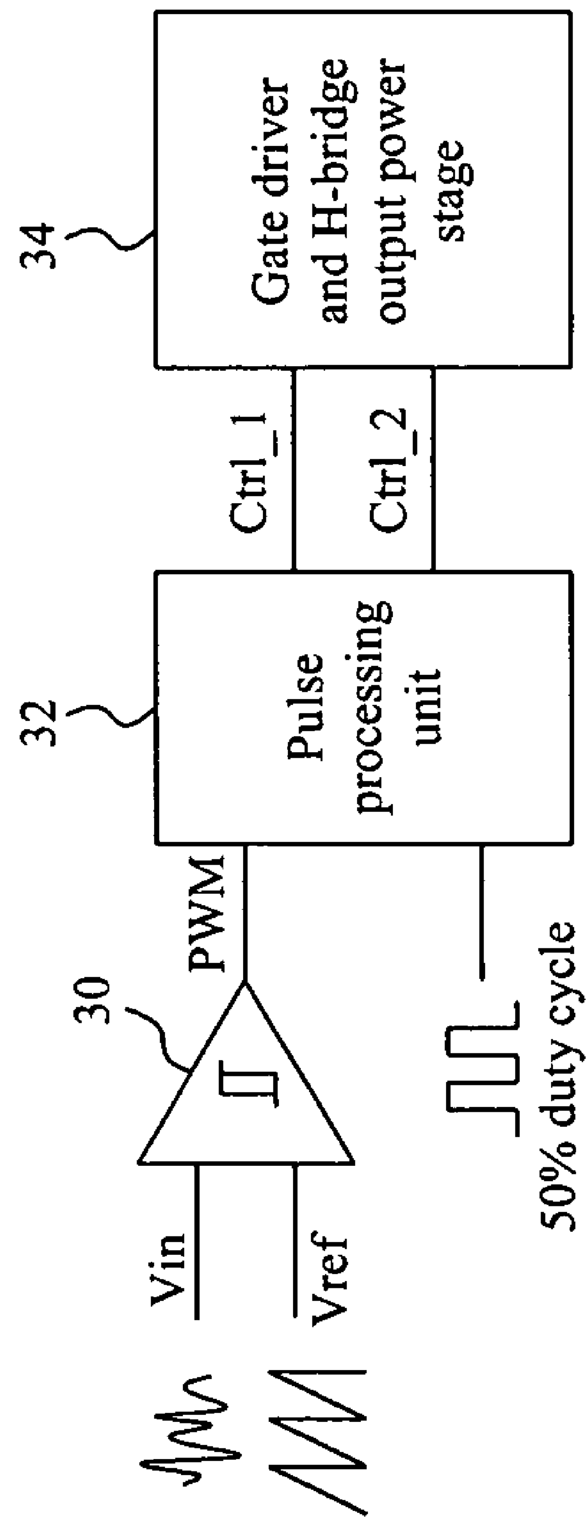
FIG. 6 is a block diagram of a second embodiment according to the present invention.
Figure 7:
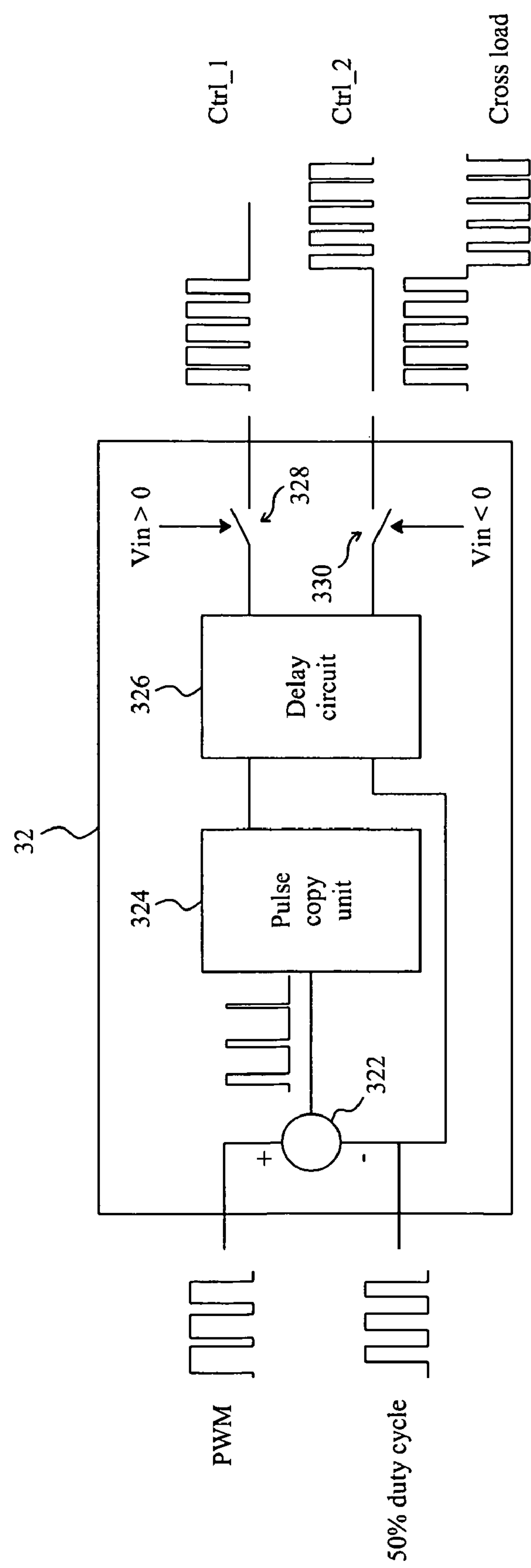
FIG. 7 is an embodiment for the pulse processing unit shown in FIG. 6.
Figure 8:
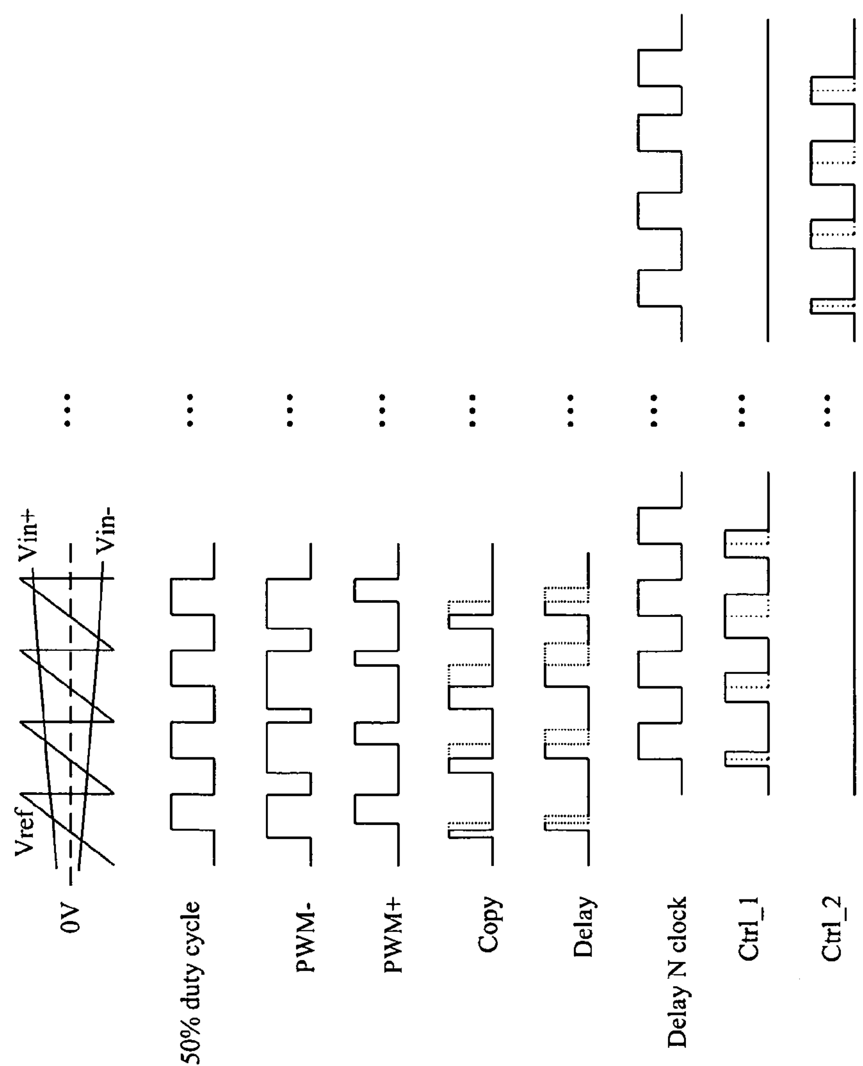
FIG. 8 is a timing diagram to show the operation of the circuit of FIG. 6.

FIG. 6 is a second embodiment according to the present invention, which has a hysteresis comparator 30 to compare the single-end input signal Vin with a carrier signal Vref, for example a sawtooth wave, so as to generate a basic PWM signal, and a pulse processing unit 32 to subtract a 50% duty cycle from the basic PWM signal to extract half width of the output PWM signal and to produce a complete pulse from the half width PWM signal. Subsequently, two PWM control signals Ctrl_1 and Ctrl_2 are produced for a gate driver and H-bridge output power stage 34. FIG. 7 is an embodiment for the pulse processing unit 32 of FIG. 6, and FIG. 8 is a timing diagram to show the operation of this circuit. In this embodiment, the single-end input signal Vin is not pre-processed. When the input signal Vin is negative, the resultant half width PWM signal is the same as that shown in the embodiment of FIG. 3, and the waveform after being copied has the same pulse width and the same phase as those of the output PWM shown in FIG. 2. However, when the input signal Vin is positive, the resultant half width driving signal after being copied has a different phase than that of the output PWM shown in FIG. 2. A delay circuit 326 delays the after-copied half width driving signal by N clocks, so that the final output signal to the gate driver and H-bridge output power stage 34 has the correct phase. The number of delay cycles N is determined according to the designer's requirement, provided the output signal is correct in timing.

The above embodiments use a single-end signal as their input although differential input signals can also be suitable to the present invention.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A circuit for generating a PWM control signal for a class-D amplifier, comprising:

a hysteresis comparator for comparing a single-end input signal with a carrier signal to generate a basic PWM signal; and a pulse processing unit coupled to the hysteresis comparator to generate the PWM control signal having a pulse width;

wherein the pulse processing unit extracts a half width of the PWM control signal from the basic PWM signal and a basic periodic signal, and then produces a complete pulse whose width equals to the pulse width of the PWM control signal.

2. The circuit of claim 1, further comprising a pre-processing unit for pre-processing the single-end input signal into a single-polarity single-end signal.

3. The circuit of claim 2, wherein the pre-processing unit comprises a comparator for comparing the single-end input signal with a direct current voltage to detect a polarity of the single-end input signal.

4. The circuit of claim 3, wherein the pre-processing unit further comprises:

an inverter coupled to the comparator to convert a portion of the single-end input signal having a first polarity into one having a second polarity; and a bypass circuit coupled to the comparator to bypass a portion of the single-end input signal having the second polarity to combine with the portion of the single-end input signal converted from the first polarity to the second polarity, so as to produce the single-polarity single-end signal.

5. The circuit of claim 1, wherein the pulse processing unit comprises a subtractor coupled to the hysteresis comparator to subtract the basic periodic signal from the basic PWM signal to generate the half width PWM signal.

6. The circuit of claim 1, wherein the pulse processing unit comprises a pulse copy unit for copying a pulse of the half width PWM signal.

7. The circuit of claim 1, wherein the pulse processing unit comprises a delay circuit for delaying the PWM control signal.

8. A method for generating a PWM control signal for a class-D amplifier, comprising the steps of:

(A) comparing a single-end input signal with a carrier signal to generate a basic PWM signal;

(B) extracting a half width of the PWM control signal from the basic PWM signal and a basic periodic signal; and (C) completing a pulse of the PWM control signal from the half width of the PWM control signal.

9. The method of claim 8, further comprising the step of:

(D) pre-processing the single-end input signal into a single-polarity single-end signal.

10. The method of claim 9, wherein the step (D) comprises comparing the single-end input signal with a direct current voltage to detect a polarity of the single-end input signal.

11. The method of claim 10, wherein the step (D) further comprises the steps of:

converting a portion of the single-end input signal having a first polarity into one having a second polarity; and combining a portion of the single-end input signal having the second polarity with the portion of the single-end input signal converted from the first polarity into the second polarity, so as to produce the single-polarity single-end signal.

12. The method of claim 8, wherein the step (C) comprises copying the half width of the PWM control signal.

13. The method of claim 8, wherein the step (C) comprises delaying the half width of the PWM control signal.

* * * * *